United States Patent
Kuo et al.

(10) Patent No.: US 9,300,305 B1
(45) Date of Patent: Mar. 29, 2016

(54) FREQUENCY SYNTHESIZER AND RELATED METHOD FOR IMPROVING POWER EFFICIENCY

(71) Applicant: MEDIATEK INC., Hsin-Chu (TW)

(72) Inventors: Chun-Ming Kuo, Hsinchu (TW); Chii-Horng Chen, Hsinchu County (TW); Shih-Chi Shen, New Taipei (TW)

(73) Assignee: MEDIATEK INC., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/557,462

(22) Filed: Dec. 2, 2014

(51) Int. Cl.
*H03L 7/099* (2006.01)
*H03M 3/00* (2006.01)

(52) U.S. Cl.
CPC .............. *H03L 7/0991* (2013.01); *H03M 3/30* (2013.01)

(58) Field of Classification Search
CPC ....... H03L 7/099; H03L 7/0991; H03M 3/30; H03M 3/32
USPC ......... 327/105, 106, 107, 147, 150, 156, 159, 327/165, 166, 291, 299
See application file for complete search history.

(56) References Cited

U.S. PATENT DOCUMENTS

| | | | | |
|---|---|---|---|---|
| 2010/0013531 A1* | 1/2010 | Ainspan | .................. | H03L 7/093 327/159 |
| 2010/0231310 A1* | 9/2010 | Wang | ........................ | H03L 7/16 331/1 A |
| 2010/0244914 A1* | 9/2010 | Kim | ........................ | H03L 7/085 327/157 |
| 2011/0090998 A1* | 4/2011 | Zhang | ..................... | H03L 7/093 375/365 |
| 2015/0116018 A1* | 4/2015 | Chen | ....................... | H03L 7/091 327/159 |

OTHER PUBLICATIONS

Staszewski, State-of-the-Art and Future Directions of High-Performance All-Digital Frequency Synthesis in Nanometer CMOS (IEEE Transactions on Circuits and Systems-I: Regular Papers, vol. 58, No. 7, Jul. 2011).

* cited by examiner

*Primary Examiner* — William Hernandez
(74) *Attorney, Agent, or Firm* — Winston Hsu; Scott Margo

(57) ABSTRACT

A frequency synthesizer includes a digitally controlled oscillator, a sigma-delta modulation circuit and a controller. The digitally controlled oscillator is arranged to generate an oscillating clock. The sigma-delta modulation circuit is arranged to generate an SDM input to the digitally controlled oscillator. The controller is arranged to adjust an operating frequency of the SDM circuit in response to a transmit power level of a transmitter using the oscillating clock.

20 Claims, 7 Drawing Sheets

FREQUENCY SYNTHESIZER AND RELATED METHOD FOR IMPROVING POWER EFFICIENCY

BACKGROUND

The disclosed embodiments of the present invention relate to an operating frequency adjusting scheme, and more particularly, to a method for adjusting operating frequency applied to a digitally-controlled oscillator (DCO) of an electronic device, such as an all-digital phase-locked loop (AD-PLL).

The phase-locked loop (PLL) is widely used in wireless communications fields, and can dynamically reduce frequency offset between a received signal and a locally generated carrier. To a deep-submicron radio frequency (RF) process, such as the 28 nm process, a digital PLL is preferred rather than an analog PLL. This is because digital calibrations can relax analog requirements of the system and provide some potential benefits, such as higher performance, lower power and lower cost. Hence, the all-digital phase locked loop (ADPLL) implemented in purely digital circuitry is widely used in the deep-submicron RF process.

The transmitter to receiver (Tx-to-Rx) band noise specification of the ADPLL is crucial for ensuring quality of mobile communication systems. A stringent scenario may occur when the Tx power is at a maximum level while the sensitivity of the Rx signal power is insufficient. As shown by Table 1 below, some Tx bands may have relatively smaller band separation between the Tx band and the Rx band (hereinafter "Tx-to-Rx band separation"). For example, Band 2 has only 80 MHz band separation. Issues such as interference and crosstalk may occur in Band 2 due to the insufficient Tx-to-Rx band separation.

TABLE 1

| Band | Tx band | Tx-to-Rx band separation (MHz) | Rx band |
|---|---|---|---|
| 1 | 1920-1980 | 190 | 2110-2170 |
| 2 | 1850-1910 | 80 | 1930-1990 |

Hence, there is a need for an innovative ADPLL design which is capable of providing enough Tx-to-Rx band separation to achieve better transmission performance.

SUMMARY

In accordance with exemplary embodiments of the present invention, a frequency synthesizer arranged for adjusting the frequency of a sigma-delta ($\Delta\Sigma$) modulation (SDM) operating frequency in response to the transmit power level, and a related method thereof are proposed to solve the above-mentioned problems.

According to a first aspect of the present invention, an exemplary frequency synthesizer is disclosed. The frequency synthesizer includes a digitally controlled oscillator (DCO), a sigma-delta modulation (SDM) circuit and a controller. The DCO is arranged to generate an oscillating clock. The SDM circuit is arranged to generate an SDM input to the DCO. The controller is arranged to adjust an operating frequency of the SDM circuit in response to a transmit power level of a transmitter using the oscillating clock.

According to a second aspect of the present invention, an exemplary frequency synthesizing method is disclosed. The frequency synthesizing method includes: generating an oscillating clock based on an sigma-delta modulation (SDM) input from a SDM circuit of a frequency synthesizer; and adjusting an operating frequency of the SDM circuit in response to a transmit power level of a transmitter using the oscillating clock.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should not be interpreted as a close-ended term such as "consist of". Also, the term "couple" is intended to mean either an indirect or direct electrical connection. Accordingly, if one device is coupled to another device, that connection may be through a direct electrical connection, or through an indirect electrical connection via other devices and connections.

In order to solve the aforementioned problems, one method raises the SDM (sigma-delta modulation) operating frequency of the ADPLL to ensure enough Tx-to-Rx band separation. For example, the SDM operating frequency may be raised to exceed an extreme high frequency (e.g. 1 GHz), which definitely meets most stringent scenarios; however, this wastes unnecessary power in normal scenarios. Another method for solving the above-mentioned issue may fine-tune the DCO physical resolution, which requires a more complex design, thus increasing the amount of control pins therein and raising the manufacturing cost. Based on the above observations, the present invention proposes an innovative design which is capable of providing enough Tx-to-Rx band separation without consuming too much power and/or raising the manufacturing cost. Further details of technical features of the present invention are described in the following.

Figure 1:
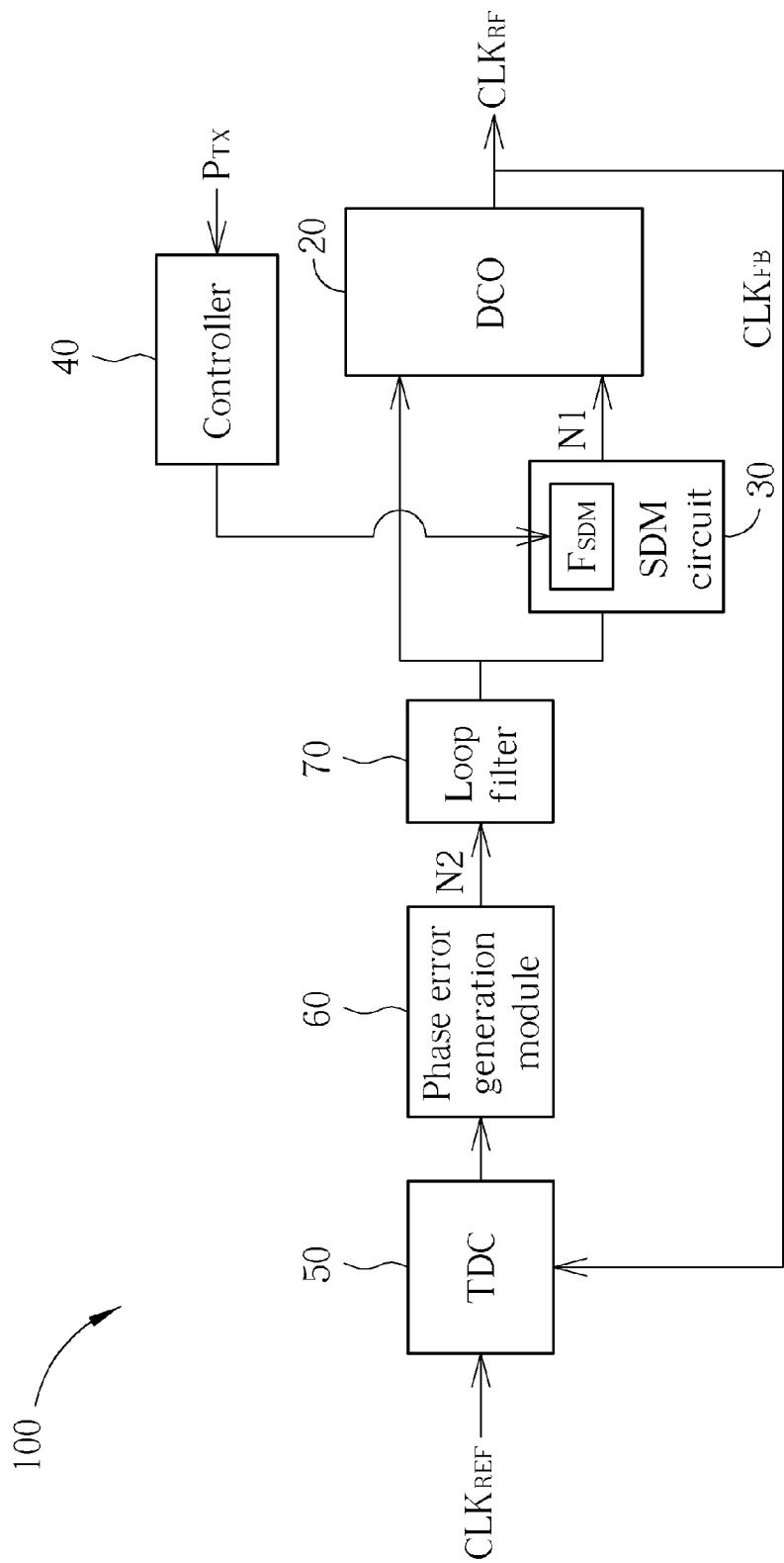
FIG. 1 is a block diagram illustrating a frequency synthesizer according to an embodiment of the present invention.

FIG. 1 is a block diagram illustrating a frequency synthesizer 100 according to an embodiment of the present invention. In one exemplary implementation, the frequency synthesizer 100 may be implemented in an All Digital Phase-Locked Loop (ADPLL). For example, the frequency synthesizer 100 may be part of the ADPLL. Further, the frequency synthesizer 100 may be included in a transmitter using a clock output of the frequency synthesizer 100. By way of example, but not limitation, the frequency synthesizer 100 includes a digitally controlled oscillator (DCO) 20, a sigma-delta (Δz) modulation (SDM) circuit 30, a controller 40, a time-to-digital converter (TDC) 50, a phase error generation module 60 and a loop filter 70.

The DCO 20 is arranged to generate a radio frequency (RF) clock $CLK_{RF}$, and the SDM circuit 30 is arranged to generate an SDM input N1 to the DCO 20. The TDC 50 is arranged to convert a time difference between an input reference clock $CLK_{REF}$ and a feedback clock $CLK_{FB}$ into a digital signal. The feedback clock $CLK_{FB}$ is derived from the RF clock $CLK_{RF}$. Based on actual design considerations, the feedback clock $CLK_{FB}$ may be the RF clock $CLK_{RF}$ or a frequency division result of the RF clock $CLK_{RF}$. The phase error generation module 60 is arranged to receive the digital signal and generate a phase error signal N2. The loop filter 70 is arranged to receive the phase error signal N2, and control the oscillation frequency of the DCO 20 based on the phase error signal N2. Since one skilled in the art of this field will know the functions of the above elements, the detailed features are omitted for brevity.

In this embodiment, the controller 40 is arranged to refer to adjust an operating frequency $F_{SDM}$ in response to a transmit power level $P_{TX}$ of a transmitter using the RF clock $CLK_{RF}$. As shown in FIG. 1, the operating frequency $F_{SDM}$ is directly adjusted by the controller 40 for the SDM circuit 30. This is merely for illustrative purposes, not a limitation to the present invention. In an example, the operating frequency of the SDM circuit 30 may be derived from the oscillating clock of the DCO 20, and the controller 40 may be arranged to change a divisor used for adjusting the operating frequency of the SDM circuit 30. This will be described later in the paragraphs related to FIG. 4.

Please note that, the transmit power level $P_{TX}$ may be determined according to the usage of the apparatus (e.g. a mobile phone), the operating environment of the apparatus, instructions assigned to the apparatus from a base station, and the power saving modes of the apparatus. In short, the apparatus can know the situation of the transmit power level $P_{TX}$ without actually monitoring the transmit power level $P_{TX}$. However, in some cases, the present invention may perform a monitoring operation based on design considerations.

Further, a relationship between the operating frequency of the SDM circuit 30 and the transmit power level $P_{TX}$ may be stored as a reference for the controller in a built-in storage device, such as a memory device. In this way, the relationship between the TX power level and the operating frequency of the SDM circuit 30 can be referred for adjustment, and the controller 30 can directly obtain this relationship without further performing a monitoring operation. However, the present invention is not limited thereto. For another example, the relationship may be stored as a look-up table (LUT), programmed as a specific code, or implemented in a circuit. Moreover, a comparator may be utilized to determine how to perform adjustments.

In this embodiment, the controller 40 is coupled to the SDM circuit 30, but the present invention is not limited thereto. For example, the controller 40 may be arranged to compare the transmit power level $P_{TX}$ with at least one threshold to generate a comparison result of the TX power level, and set the operating frequency $F_{SDM}$ for the SDM circuit 30 according to the comparison result. However, this is for illustrative purposes, not a limitation to the present invention. In some embodiments, the above comparing operation may be skipped, e.g. by utilizing a look-up table.

The aforementioned threshold can be set in the controller 40, or inputted to the controller 40 from another element. In this embodiment, since the variation of the transmit power level $P_{TX}$ can be known, the required operating frequency $F_{SDM}$ can be precisely controlled by the controller 40, thus avoiding unnecessarily wasting power. Although the scheme of adjusting the operating frequency $F_{SDM}$ is illustrated in the example of FIG. 1, it is not a limitation to the present invention. More schemes of adjusting the operating frequency $F_{SDM}$ are illustrated in the examples of following FIGS. 4-7. All the schemes shown in FIGS. 1 and 4-7 can be arbitrarily combined, and some different elements shown in FIGS. 1 and 4-7 are alternative. The modifications/combinations based on any of the schemes shown in FIGS. 1 and 4-7 fall within the claimed scope of the present invention.

Figure 2:
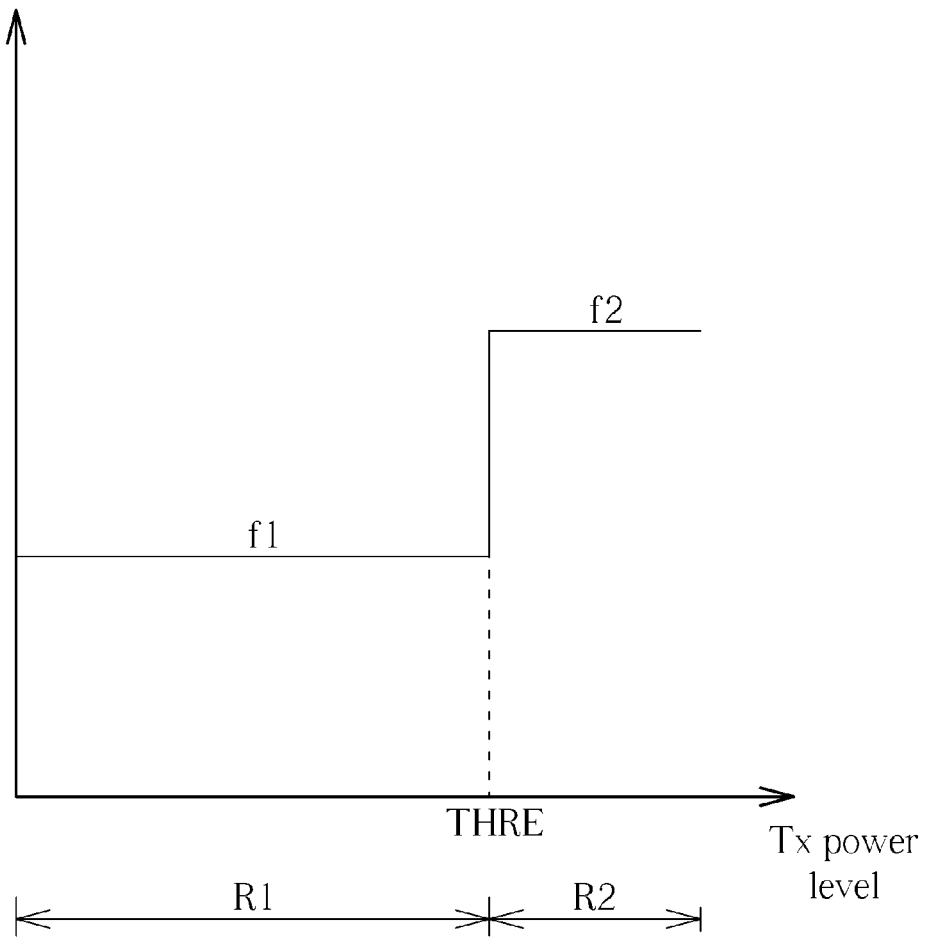
FIG. 2 is a diagram illustrating an SDM operating frequency selection scheme applied to the frequency synthesizer shown in FIG. 1.

A detailed example of the above concept can be known by referring to FIG. 2, which is a diagram illustrating an operating frequency selection scheme applied to the frequency synthesizer 100 shown in FIG. 1. FIG. 2 shows a step function for adjusting an operating frequency. In this embodiment, the controller 40 may dynamically adjust the operating frequency of the SDM circuit in response to the transmit power level by the step function. Please note that in the entire specification, the term "dynamically" is used to describe a scenario that the operating frequency can be instantly adjusted according to the variation of the transmit power. However, the present invention does not limit that the operating frequency has to always be adjusted. In practice, the present invention can be simplified to use only two ranges to achieve the control of frequency. The following paragraphs and figures illustrate the detailed implementation of the above two-ranges scheme. Further, the operation of adjusting the operating frequency can be set to be enabled/initialized only at a specific timing or when a specific event occurs.

In the scheme of FIG. 2, the operating frequency of the SDM circuit 30 is determined according to the transmit power level of a transmitter (i.e. Tx power level) using the RF clock $CLK_{RF}$. More specifically, at least one threshold (e.g. the threshold THRE) may be arranged to determine a setting of the operating frequency. In a case where the operating frequency is set by a first operating frequency f1, if the Tx power level exceeds the threshold THRE, the operating frequency will be switched to a second operating frequency f2 from the currently used first operating frequency f1, wherein the second operating frequency f2 is higher than the first operating frequency f1. The frequency synthesizer 100 may provide enough Tx-to-Rx band separation when the Tx power level is high, and employ a lower operating frequency when the Tx power level is low, so as to reduce power consumption. If, however, the Tx power level does not exceed the threshold, the operating frequency will be controlled to remain at the first operating frequency f1. In this way, no matter the Tx power level is high or low, the required Tx-to-Rx band separation can be guaranteed based on the predetermined threshold.

As shown in FIG. 2, the transmit power level of the step function is divided into two ranges by one threshold THRE, wherein each of the two ranges corresponds to a different operating frequency. This is for illustrative purposes, and not meant to be a limitation. For example, the step function may be divided into more ranges by using more thresholds. That is, the precision of the frequency control can be fine-tuned by setting more thresholds.

The controller 40 is arranged to set the operating frequency provided to the SDM circuit 30 to a first operating frequency f1 when the transmit power level is within a first power level range R1, and to set the operating frequency provided to the SDM circuit 30 to a second operating frequency f2 when the transmit power level is within a second power level range R2, wherein the center power level of the second power level range R2 is higher than a center power level of the first power level range R1, and the second operating frequency f2 is higher than the first operating frequency f1. Please note that the first power level range R1 is not overlapped with the second power level range R2. The intensity of the Tx power level may be preset from 1 to 10. Further, the first power level range R1 may represent the intensities 0-5, and the second power level range R2 may represent the intensities 6-10. When the intensity of the operating Tx power level is found to be 3, the first operating frequency f1 will be selected; and when the intensity of the operating Tx power level is found to be 8, the second operating frequency f2 will be selected.

Specifically, the controller 40 of the frequency synthesizer 100 may set the operating frequency $F_{SDM}$ by the first operating frequency f1 when the system information and/or a comparison result indicates that the transmit power level $P_{TX}$ is not larger than the threshold THRE; and the controller 40 of the frequency synthesizer 100 may set the operating frequency $F_{SDM}$ by the second operating frequency f2 which is higher than the first operating frequency f1 when the system information and/or a comparison result indicates that the transmit power level $P_{TX}$ is larger than the threshold THRE. This is merely for illustrative purposes, and not meant to be a limitation.

In other words, the threshold THRE may be set by the controller 40 according to actual needs, and more particularly, according to at least a receive power level of a receiver. The threshold may be determined by the equation: "Threshold=Level_Rx−SEN+CONS," wherein the parameter Level_Rx represents the receive power level of a receiver, the parameter SEN represents the sensitivity of the receiver, and the parameter CONS represents a constant. It should be noted that the parameter SEN may be determined by the modulation scheme of the receiver. For example, the Quadrature Amplitude Modulation (QAM) technique may provide a higher sensitivity, while the Binary Phase Shift Keying (BPSK) technique or the Quadrature Phase Shift Keying (QPSK) technique may provide a lower sensitivity. Further, the parameter SEN can be an indicator of the demodulation capability of the receiver. Based on the above equation, a higher sensitivity may result in a lower threshold, and a higher receive power level of a receiver may result in a higher threshold.

The parameter CONS is added to reflect some variance occurring in the environment or based on the design requirements. The controller 40 may set the at least one threshold according to at least a signal-to-noise ratio (SNR) requirement. The SNR requirement can be viewed as the sensitivity of receiver minus the noise level (SNR requirement=SEN−noise). Accordingly, a high sensitivity may be required for a high noise environment.

In a case where a frequency synthesizer does not obtain the detailed baseband situation, the operating frequency may be fixed. The frequency synthesizer must therefore raise the operating frequency to exceed an extreme high frequency (e.g. 1 GHz) to provide enough Tx-to-Rx band separation, which wastes unnecessary power in normal scenarios. In contrast, the exemplary frequency synthesizer 100 of the present invention refers to the transmit power level $P_{TX}$ of a transmitter, to adjust the operating frequency $F_{SDM}$ in response to the transmit power level, so as to provide the desired Tx-to-Rx band separation without increasing the design difficulty (e.g. configuring more control pins) and the cost thereof. The exemplary frequency synthesizer 100 of the present invention may achieve the desired Tx-to-Rx band separation without unnecessarily wasting power. Moreover, since the threshold employed by the controller 40 of the frequency synthesizer 100 may be properly determined according to the receive power level and the sensitivity of the receiver, the power efficiency of the transmitter employing the frequency synthesizer 100 can be improved.

Figure 3:
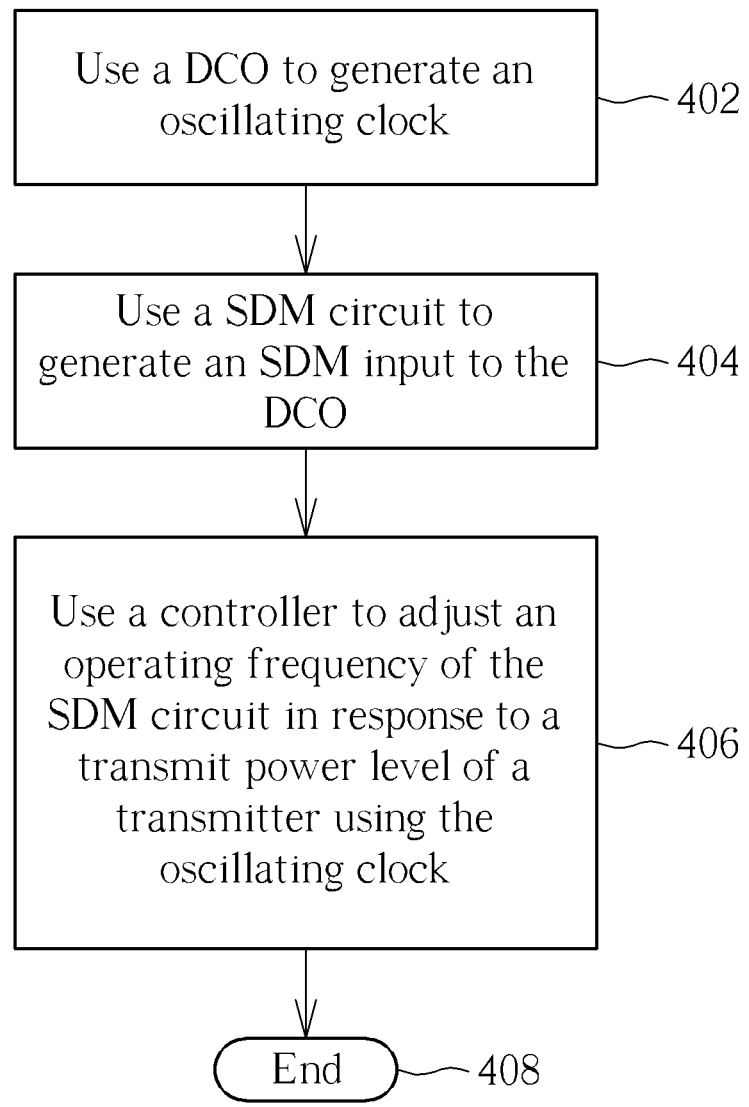
FIG. 3 is a flowchart illustrating a frequency synthesizing method according to an embodiment of the present invention.

FIG. 3 is a flowchart illustrating a frequency synthesizing method according to an embodiment of the present invention. If the result is substantially the same, the steps are not required to be executed in the exact order shown in FIG. 3; that is, other steps can be asserted therein. The method shown in FIG. 3 may be employed by the frequency synthesizer 100 shown in FIG. 1, and can be briefly summarized as follows.

Step 402: Use a DCO to generate an oscillating clock;
Step 404: Use a SDM circuit to generate an SDM input to the DCO;
Step 406: Use a controller to adjust an operating frequency of the SDM circuit in response to a transmit power level of a transmitter using the oscillating clock.
Step 408: End.

As one skilled in the art can understand details of each step after reading the above paragraphs directed to the frequency synthesizer 100, further description is omitted here for brevity.

Figure 4:
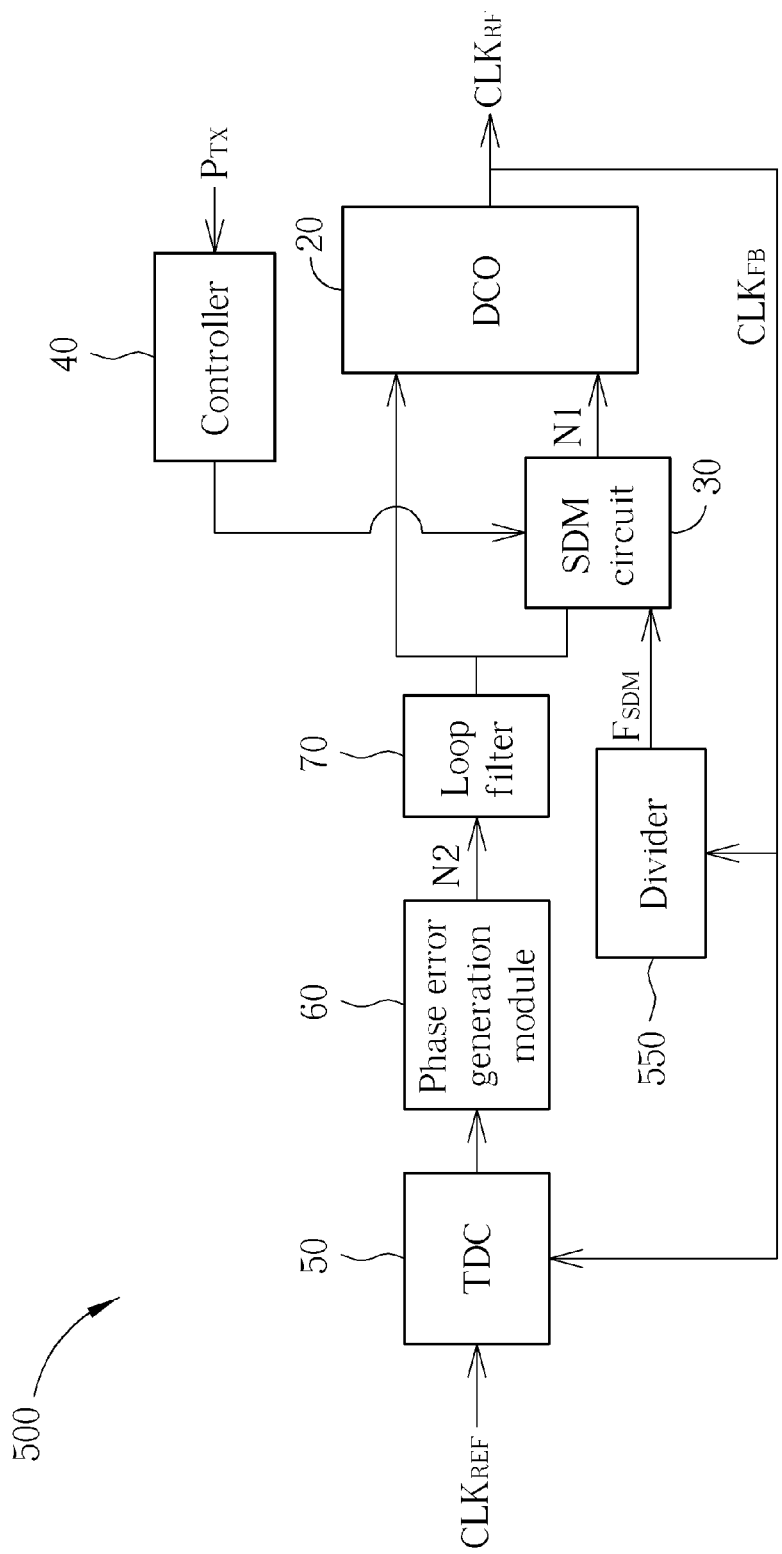
FIG. 4 is a block diagram illustrating a frequency synthesizer according to another embodiment of the present invention.

Refer to FIG. 4, which is a block diagram illustrating a frequency synthesizer 500 according to another embodiment of the present invention. The difference between the frequency synthesizers 100 and 500 is that the frequency synthesizer 500 further includes a dividing circuit 550, which is inputted by the feedback path. The dividing circuit 550 is arranged to provide the operating frequency $F_{SDM}$ to the SDM circuit 30. For example, the dividing circuit 550 may utilize a divisor to obtain the operating frequency $F_{SDM}$ with the following equation:

$$\text{DCO SDM clock} = \text{DCO clock}/Nd \cos dm$$

The parameter DCO SDM clock denotes the operating frequency of the SDM circuit 30, the parameter DCO clock denotes the oscillating clock of the DCO 20, and the parameter Ndcosdm denotes a divisor, wherein the parameter Ndcosdm may be a positive integer.

Figure 5:
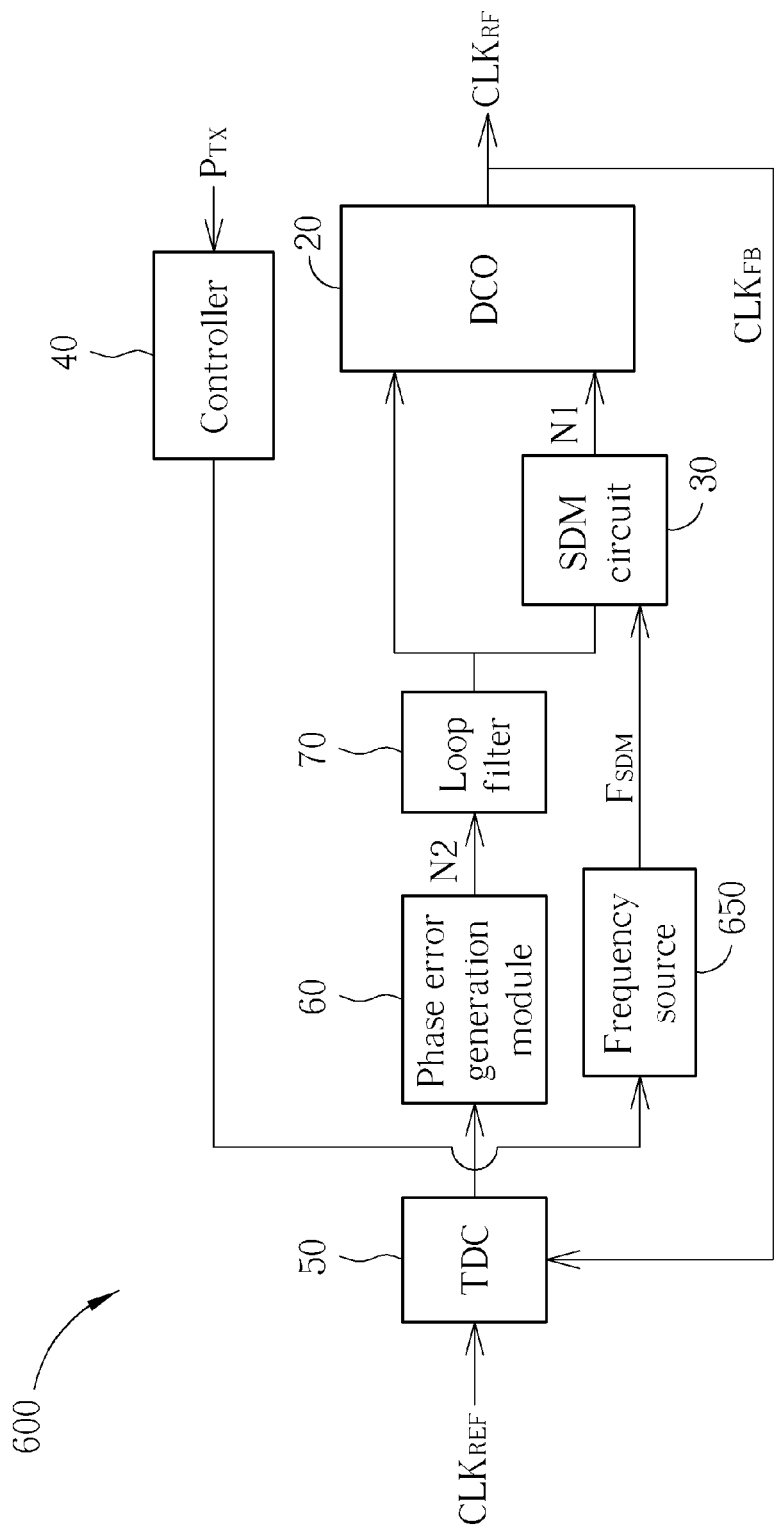
FIG. 5 is a block diagram illustrating a frequency synthesizer according to another embodiment of the present invention.

However, this is not a limitation. In some embodiments, the oscillating clock of the DCO 20 may be directly generated by a dedicated frequency. Refer to FIG. 5, which is a block diagram illustrating a frequency synthesizer 600 according to another embodiment of the present invention, the frequency synthesizer 600 includes a frequency source 650, arranged to provide one or multiple dedicated frequency to the SDM circuit 30 based on the transmit power level.

Figure 6:
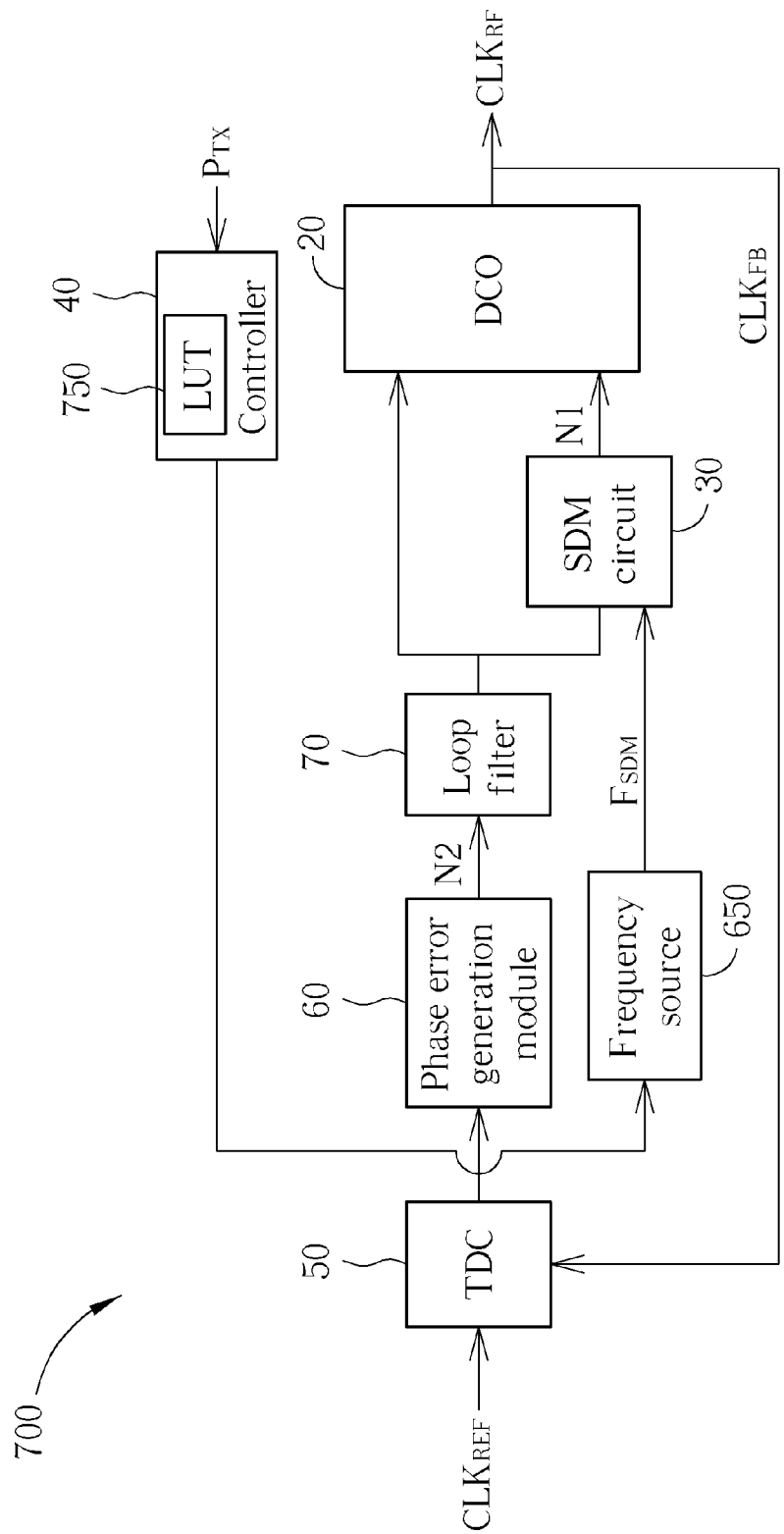
FIG. 6 is a block diagram illustrating a frequency synthesizer according to another embodiment of the present invention.

Further, refer to FIG. 6, which is a block diagram illustrating a frequency synthesizer 700 according to another embodiment of the present invention. The difference between the frequency synthesizers 600 and 700 is that, the controller 40 of the frequency synthesizer 700 further utilizes a look-up table (LUT) 750 as a reference for the frequency source 650, so as to adjust the operating frequency $F_{SDM}$ for the SDM circuit 30. In this way, the frequency adjusting operation can be made without performing a lot of calculations. Specifically, since the adjusting amount can be obtained by directly checking the LUT 750 if the transmit power level is known/given, the calculations for determining the adjusting amount can be saved. Please note that the LUT 750 is not limited to be configured inside the controller 40 as shown in FIG. 6. In practice, the LUT 750 may be configured outside the controller 40. For example, the LUT 750 may be inputted to the controller from another element.

Figure 7:
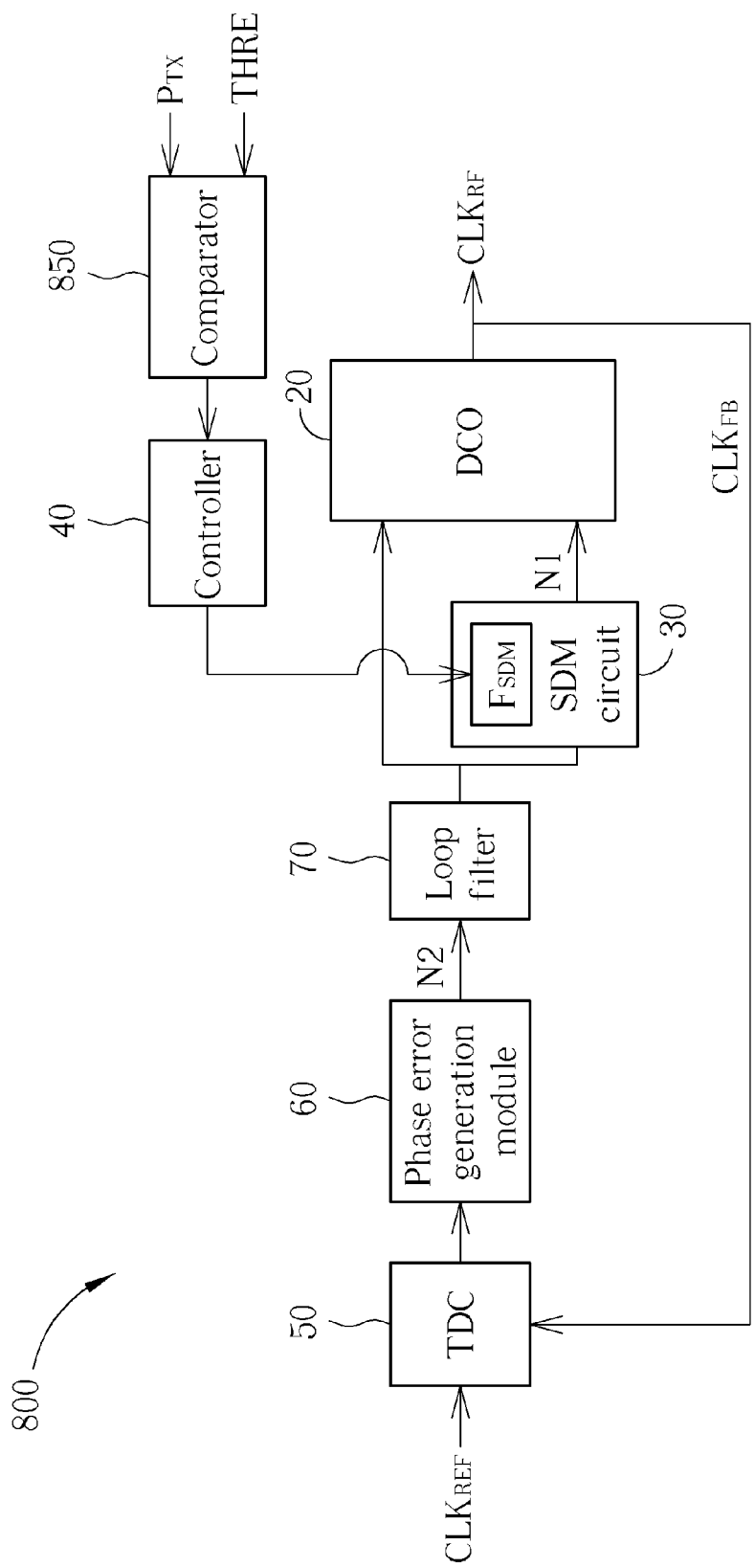
FIG. 7 is a block diagram illustrating a frequency synthesizer according to another embodiment of the present invention.

Refer to FIG. 7, which is a block diagram illustrating a frequency synthesizer 800 according to another embodiment of the present invention. The difference between the frequency synthesizers 100 and 800 is that, the frequency synthesizer 800 further includes a comparator 850, coupled to the controller 40. The comparator is arranged to compare the transmit power level $P_{TX}$ with a threshold (e.g. the threshold THRE mentioned above), to generate a comparison result to the controller 40. Then, the controller 40 may adjust the transmit power level $F_{SDM}$ provided to the SDM circuit 30 according to the comparison result. Similarly, more thresholds can be applied in this embodiment.

Various schemes for adjusting the operating frequency to the SDM circuit 30 are provided in FIGS. 1 and 4-7, and these schemes support one another in practice. These schemes can be utilized to implement the aforementioned transmit power level based frequency adjustment. Further, any modifications/combination derived from these schemes belongs to the scope of the present invention.

To summarize, embodiments of the present invention disclose a frequency synthesizer for modulating operating frequency through according to the transmit power level of a transmitter using a clock output of the frequency synthesizer. With the aid of the disclosed frequency synthesizer, the desired Tx-to-Rx band separation may be achieved without raising the power consumption and/or increasing the complexity of the hardware design.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A frequency synthesizer, comprising:
   a digitally controlled oscillator (DCO), arranged to generate an oscillating clock;
   a sigma-delta modulation (SDM) circuit, arranged to generate an SDM input to the DCO; and
   a controller, arranged to adjust an operating frequency of the SDM circuit in response to a transmit power level of a transmitter using the oscillating clock.

2. The frequency synthesizer of claim 1, wherein the frequency synthesizer is implemented in an all-digital phase-locked loop (ADPLL).

3. The frequency synthesizer of claim 1, wherein the controller is arranged to set the operating frequency of the SDM circuit to a first operating frequency when the transmit power level is within a first power level range, and to set the operating frequency of the SDM circuit to a second operating frequency when the transmit power level is within a second power level range.

4. The frequency synthesizer of claim 3, wherein when a center power level of the first power level range is higher than a center power level of the second power level range, the first operating frequency is higher than the second operating frequency.

5. The frequency synthesizer of claim 3, wherein the first power level range is not overlapped with the second power level range.

6. The frequency synthesizer of claim 1, wherein a relationship between the operating frequency of the SDM circuit and the transmit power level is stored as a reference for the controller.

7. The frequency synthesizer of claim 1, wherein the controller is arranged to adjust the operating frequency of the SDM circuit in response to the transmit power level by a step function.

8. The frequency synthesizer of claim 1, wherein the operating frequency of the SDM circuit is derived from the oscillating clock, and the controller is arranged to change a divisor for adjusting the operating frequency of the SDM circuit.

9. The frequency synthesizer of claim 1, wherein the controller is arranged to compare the transmit power level with a threshold to generate a comparison result, and sets the operating frequency of the SDM circuit according to the comparison result.

10. The frequency synthesizer of claim 9, wherein the controller sets the operating frequency of the SDM circuit to a first operating frequency when the comparison result indicates that the transmit power level is larger than the threshold, and sets the operating frequency of the SDM circuit to a second operating frequency different from the first operating frequency when the comparison result indicates that the transmit power level is not larger than the threshold.

11. The frequency synthesizer of claim 10, wherein the second operating frequency is lower than the first operating frequency.

12. The frequency synthesizer of claim 1, wherein the controller is arranged to adjust the operating frequency of the SDM circuit with reference to at least one threshold of the transmit power level.

13. The frequency synthesizer of claim 12, wherein the controller sets the at least one threshold according to at least a receive power level of a receiver.

14. The frequency synthesizer of claim 12, wherein the controller sets the at least one threshold according to at least a sensitivity of a receiver.

15. The frequency synthesizer of claim 12, wherein the controller sets the at least one threshold according to at least a signal-to-noise ratio (SNR) requirement of a receiver.

16. A frequency synthesizing method, comprising:
    generating an oscillating clock based on a sigma-delta modulation (SDM) input from an SDM circuit of a frequency synthesizer; and
    adjusting an operating frequency of the SDM circuit in response to a transmit power level of a transmitter using the oscillating clock.

17. The frequency synthesizing method of claim 16, wherein the frequency synthesizer is implemented in an all-digital phase-locked loop (ADPLL).

18. The frequency synthesizing method of claim 16, wherein the step of adjusting the operating frequency of the SDM circuit in response to the transmit power level of the transmitter using the oscillating clock comprises:
    setting the operating frequency of the SDM circuit to a first operating frequency when the transmit power level is within a first power level range; and
    setting the operating frequency of the SDM circuit to a second operating frequency when the transmit power level is within a second power level range.

19. The frequency synthesizing method of claim 18, wherein when a center power level of the first power level range is higher than a center power level of the second power level range, the first operating frequency is higher than the second operating frequency.

20. The frequency synthesizing method of claim 16, wherein the step of adjusting the operating frequency of the SDM circuit in response to the transmit power level of the transmitter using the oscillating clock comprises:
    adjusting the operating frequency of the SDM circuit in response to the transmit power level by a step function.

* * * * *